(12) United States Patent
Uematsu et al.

(10) Patent No.: US 9,691,803 B2
(45) Date of Patent: Jun. 27, 2017

(54) SEMICONDUCTOR WAFER, METHOD FOR MANUFACTURING LIGHT RECEIVING SENSOR, AND LIGHT RECEIVING SENSOR

(71) Applicant: Seiko Epson Corporation, Shinjuku-ku (JP)

(72) Inventors: Akira Uematsu, Suwa (JP); Atsushi Matsuo, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/640,314

(22) Filed: Mar. 6, 2015

(65) Prior Publication Data
US 2015/0279887 A1 Oct. 1, 2015

(30) Foreign Application Priority Data
Mar. 28, 2014 (JP) ................. 2014-067766

(51) Int. Cl.
*H01L 31/0232* (2014.01)
*H01L 27/146* (2006.01)

(52) U.S. Cl.
CPC .... *H01L 27/14632* (2013.01); *H01L 27/1462* (2013.01); *H01L 27/14621* (2013.01); *H01L 27/14625* (2013.01); *H01L 27/14636* (2013.01); *H01L 27/14685* (2013.01); *H01L 27/14687* (2013.01)

(58) Field of Classification Search
CPC ......... H01L 27/14632; H01L 27/14621; H01L 27/1462; H01L 27/14685; H01L 27/14636; H01L 27/14687; H01L 27/14625
See application file for complete search history.

(56) References Cited

U.S. PATENT DOCUMENTS 8,058,549 B2 * 11/2011 Kothari ................. G02B 5/285
  136/244
8,847,236 B2    9/2014 Watanabe
(Continued)

FOREIGN PATENT DOCUMENTS

JP    2000-352612 A    12/2000
JP    2003-177238 A     6/2003
(Continued)

OTHER PUBLICATIONS

Park, et al., "A Warpage of Wafer Level Bonding for CIS (CMOS Image Sensor) Device Using Polymer Adhesive," Electronic Packaging Technology and High Density Packaging (ICEPT-HDP); IEEE, Aug. 10, 2009, pp. 577-580.
(Continued)

*Primary Examiner* — Trung Q Dang
*Assistant Examiner* — Wasiul Haider
(74) *Attorney, Agent, or Firm* — Kilpatrick Townsend & Stockton LLP

(57) ABSTRACT

A semiconductor wafer includes a semiconductor substrate, a dielectric multilayer film formed on the semiconductor substrate and serving as an optical filter on a light receiving sensor, and a light detection region formed in the semiconductor substrate, with the Poisson ratio VS, Young's modulus ES, the radius r, and the thickness b of the semiconductor substrate, stress σ in the dielectric multilayer film, and the thickness d of the dielectric multilayer film satisfy a relationship $1.0 \times 10^{-3} \geq \{3 \times r^2 \times d \times (1-VS) \times \sigma\}/(ES \times b^2)$.

10 Claims, 14 Drawing Sheets

(56) References Cited

U.S. PATENT DOCUMENTS

| | | | |
|---|---|---|---|
| 2006/0222821 A1* | 10/2006 | Masai | H01F 17/0006 |
| | | | 428/174 |
| 2009/0294779 A1 | 12/2009 | Ida et al. | |
| 2012/0107968 A1* | 5/2012 | Yoshizumi | B82Y 20/00 |
| | | | 438/5 |
| 2014/0284670 A1* | 9/2014 | Kawashima | H01L 27/14603 |
| | | | 257/291 |

FOREIGN PATENT DOCUMENTS

| | | |
|---|---|---|
| JP | 2013-149733 A | 8/2013 |
| JP | 2013-185887 A | 9/2013 |

OTHER PUBLICATIONS

Extended European search report, dated Jul. 16, 2015, of the corresponding European Application No. 15161046.6.

\* cited by examiner

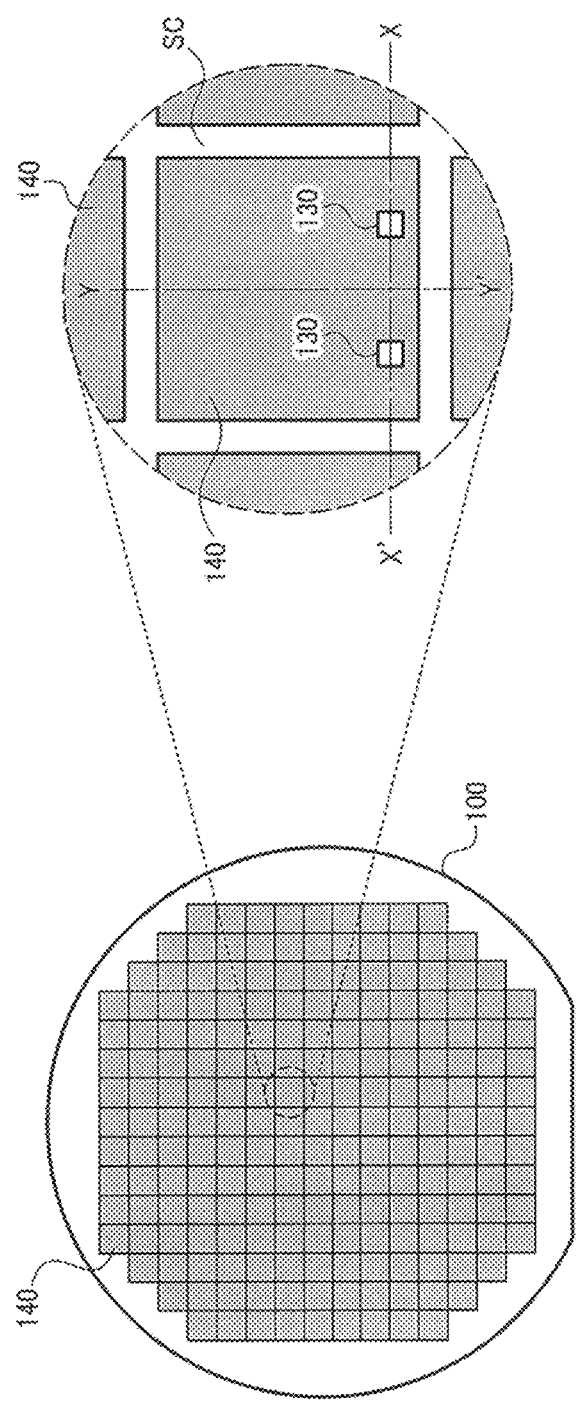

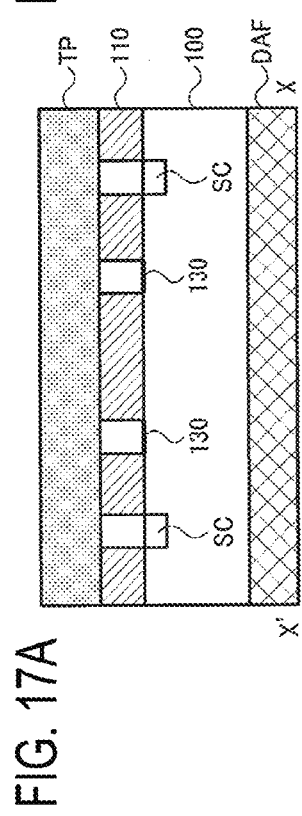
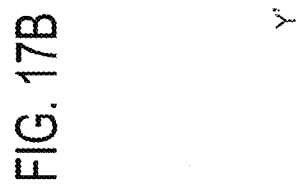
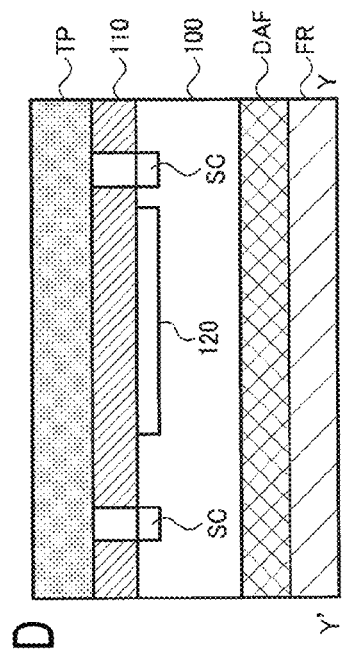
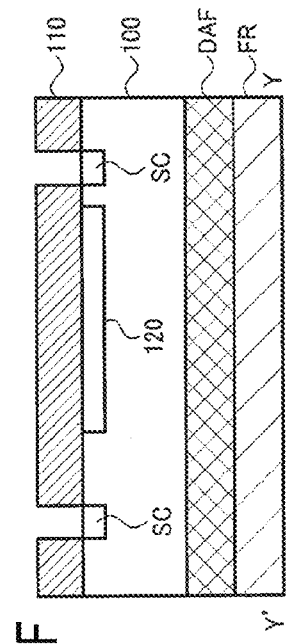
FIG. 17A  FIG. 17B
FIG. 17C  FIG. 17D
FIG. 17E  FIG. 17F

SEMICONDUCTOR WAFER, METHOD FOR MANUFACTURING LIGHT RECEIVING SENSOR, AND LIGHT RECEIVING SENSOR

This application claims priority to Japanese Patent Application No. 2014-067766, filed Mar. 28, 2014, the entirety of which is hereby incorporated by reference.

BACKGROUND

1. Technical Field

The present invention relates, for example, to a semiconductor wafer, a method for manufacturing a light receiving sensor, and a light receiving sensor.

2. Related Art

A method for forming some kind of film on a semiconductor wafer is widely known in related art. For example, JP-A-2013-149733 discloses a method for forming a high-quality single-crystal silicon carbide film on a silicon substrate.

JP-A-2000-352612 discloses a multilayer film filter that selectively transmits light of an infrared wavelength range. JP-A-2000-352612 assumes that the multilayer film filter is formed on a glass bulb surface or any other light transmissive substrate and therefore does not particularly describe formation of the multilayer film filter on a semiconductor substrate (semiconductor wafer).

When a film is formed on a semiconductor wafer, the film has internal stress that deforms the wafer (substrate) into a convex or concave shape. The amount of warpage of the wafer increases in some situations. In JP-A-2013-149733, a stress relaxation film that relaxes the stress is formed on an opposite surface of the substrate to the surface on which the single-crystal silicon carbide film is formed. It is therefore undesirably necessary to provide another film different from the film originally desired to be formed (single-crystal silicon carbide film).

When a multilayer film, such as that shown in JP-A-2000-352612, is used, the film produces larger stress than in a case where a thin film formed of a smaller number of layers is formed, undesirably resulting in a greater amount of warpage of the wafer. In this regard, JP-A-2000-352612 does not consider formation of the multilayer film above a semiconductor wafer or, of course, warpage of the semiconductor wafer.

SUMMARY

An advantage of some aspects of the invention is to provide a semiconductor wafer warpage of which is suppressed by variably setting the radius, thickness, and other parameters of a semiconductor substrate, and further provide a method for manufacturing a light receiving sensor, a light receiving sensor, and others.

An aspect of the invention relates to a semiconductor wafer including a semiconductor substrate, a dielectric multilayer film formed above the semiconductor substrate and serving as an optical filter of a light receiving sensor, and a light detection region formed in the semiconductor substrate, and the Poisson ratio VS of the semiconductor substrate, Young's modulus ES of the semiconductor substrate, the radius r of the semiconductor substrate, the thickness b of the semiconductor substrate, stress σ in the dielectric multilayer film, and the thickness d of the dielectric multilayer film satisfy a relationship $1.0 \times 10^{-3} \geq \{3 \times r^2 \times d \times (1-VS) \times \sigma\}/(ES \times b^2)$.

In the aspect of the invention, in a semiconductor wafer formed of a semiconductor substrate above which a dielectric multilayer film is formed, the relationship among the radius, thickness, and other parameters of the semiconductor substrate is set based on the expression described above. Therefore, even when a dielectric multilayer film that produces large stress that warps the substrate is formed, the amount of warpage of the wafer can be reduced and other disadvantages are eliminated without provision of a dedicated member that relaxes the stress or any other member.

In the aspect of the invention, the dielectric multilayer film may be a film in which a first refractive index layer having a first refractive index and a second refractive index layer having a second refractive index smaller than the first refractive index are laminated on each other.

With this configuration, the dielectric multilayer film can be formed by laminating two layers having different refractive indices, and other advantages are provided.

In the aspect of the invention, the first refractive index layer may be a layer made of a titanium oxide, and the second refractive index layer may be a layer made of a silicon oxide.

With this configuration, the dielectric multilayer film can be formed by using the layer made of a titanium oxide and the layer made of a silicon oxide, and other advantages are provided.

In the aspect of the invention, the dielectric multilayer film may be a film that forms a bandpass filter.

With this configuration, the dielectric multilayer film can be used as a bandpass filter, and other advantages are provided.

In the aspect of the invention, the dielectric multilayer film may be an optical filter having a first group of refractive index layers and a second group of refractive index layers with the first group of refractive index layers attenuating a first frequency band, the second group of refractive index layers attenuating a second frequency band, and a third frequency band between the first frequency band and the second frequency band serving as a pass band.

With this configuration, the first and second groups of refractive index layers attenuate light of first and second frequency bands, respectively, whereby a bandpass filter having a pass band equal to the third frequency band can be achieved, and other advantages are provided.

In the aspect of the invention, the radius r of the semiconductor substrate, the thickness b of the semiconductor substrate, the stress σ in the dielectric multilayer film, and the thickness d of the dielectric multilayer film may satisfy a relationship $1.0 \times 10^{-3} \geq 0.138 \times 10^{-10} \times r^2 \times d \times \sigma/b^2$.

With this configuration, when a specific semiconductor substrate (silicon substrate in a narrow sense) is used, parameters that allow reduction in the amount of warpage can be appropriately determined, and other advantages are provided.

In the aspect of the invention, at least one of the radius r of the semiconductor substrate, the thickness b of the semiconductor substrate, the stress σ in the dielectric multilayer film, and the thickness d of the dielectric multilayer film may be variably so set that $1.0 \times 10^{-3} \geq \{3 \times r^2 \times d \times (1-VS) \times \sigma\}/(ES \times b^2)$ is satisfied.

With this configuration, based on the expression described above, at least one of r, b, σ, and d can be used as a variable parameter to set an appropriate relationship among them, and other advantages are provided.

Another aspect of the invention relates to a method for manufacturing a light receiving sensor, the method including forming a light detection region in a semiconductor substrate, forming a dielectric multilayer film above the semiconductor substrate, the dielectric multilayer film serving as an optical filter on or above a light receiving sensor, and dicing the semiconductor substrate above which the dielectric multilayer film has been formed to cut the light receiving sensor out of the semiconductor substrate, and the Poisson ratio VS of the semiconductor substrate, Young's modulus ES of the semiconductor substrate, the radius r of the semiconductor substrate, the thickness b of the semiconductor substrate, stress σ in the dielectric multilayer film, and the thickness d of the dielectric multilayer film satisfy a relationship $1.0 \times 10^{-3} \geq \{3 \times r^2 \times d \times (1-VS) \times \sigma\}/(ES \times b^2)$.

In the aspect of the invention, the method may further include removing the dielectric multilayer film present in a scribe region of the light receiving sensor after the forming of the dielectric multilayer film but before the dicing.

With this configuration, the dielectric multilayer film formed in a region where no dielectric multilayer film is required can be removed, and other advantages are provided.

In the aspect of the invention, the removing may be a liftoff process.

With this configuration, even when the dielectric multilayer film is hard or otherwise difficult to remove, the dielectric multilayer film can be appropriately removed, and other advantages are provided.

Still another aspect of the invention relates to a light receiving sensor produced by dicing a semiconductor wafer, the semiconductor wafer including a semiconductor substrate, a dielectric multilayer film formed above the semiconductor substrate and serving as an optical filter on or above a light receiving sensor, and a light detection region formed in the semiconductor substrate, with the Poisson ratio VS of the semiconductor substrate, Young's modulus ES of the semiconductor substrate, the radius r of the semiconductor substrate, the thickness b of the semiconductor substrate, stress σ in the dielectric multilayer film, and the thickness d of the dielectric multilayer film satisfy a relationship $1.0 \times 10^{-3} \geq \{3 \times r^2 \times d \times (1-VS) \times \sigma\}/(ES \times b^2)$.

BRIEF DESCRIPTION OF THE DRAWINGS

The invention will be described with reference to the accompanying drawings, wherein like numbers reference like elements.

FIG. 10A is a plan view of the semiconductor wafer, FIG. 10B is a plan view of a single light receiving sensor and portions therearound.

FIGS. 17A to 17F describe a dicing preparatory step.

DESCRIPTION OF EXEMPLARY EMBODIMENTS

An embodiment of the invention will be described below. It is noted that the present embodiment, which will be described below, is not intended to unduly limit the contents of the invention set forth in the appended claims. Further, all configurations described in the present embodiment are not necessarily essential configuration requirements of the invention.

1. Method According to Present Embodiment

A method according to the present embodiment will first be described. As described above, when a film is formed on or above a substrate of a semiconductor wafer, the film exerts stress on the substrate and deforms it into a convex or concave shape. JP-A-2013-149733, for example, discloses a method for suppressing warpage of a wafer produced when a high-quality single-crystal silicon carbide film is formed on a silicon substrate.

In the method in JP-A-2013-149733, a stress relaxation film is formed separately from a film originally desired to be formed (single-crystal silicon carbide film). It is therefore necessary to form a member (or structure) used solely for the stress relaxation, undesirably resulting in more effort in manufacturing the wafer and an increase in the number of parts.

A typical semiconductor wafer rarely has a very large amount of warpage in the first place. The warpage in the present embodiment is particularly assumed to be so large that the wafer cannot be inserted into a wafer box or so large that a manufacturing apparatus cannot suck the wafer. A typical semiconductor wafer is unlikely to have such a large amount of warpage. Some driver substrates, when they are very long and slender, may have a large amount of warpage, but it cannot be said that such a large amount of warpage is a typical problem.

Figure 1B:
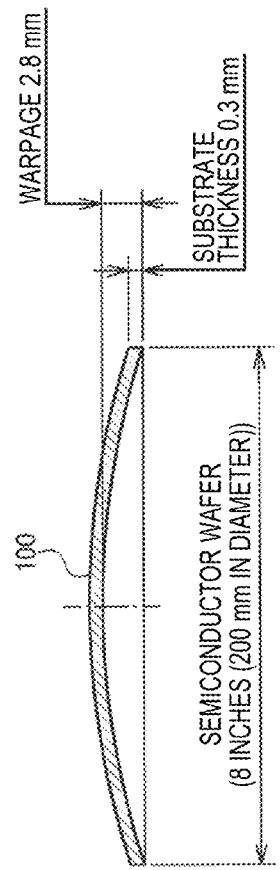
FIGS. 1A and 1B describe that the amount of warpage of a wafer increases when a dielectric multilayer film is formed above the wafer.

In contrast, in the present embodiment, a dielectric multilayer film (multilayer film optical filter) is formed on or above a semiconductor wafer. The multilayer film optical filter in the present embodiment is a filter formed of about 60 (or 61) layers, as will be described later with reference, for example, to FIG. 4. The multilayer film therefore produces larger stress than in a case where a film formed of a smaller number of layers is formed, undesirably resulting in a greater amount of warpage of the wafer. For example, when a wafer having a substrate diameter of 200 mm (typical 8-inch substrate) and a substrate thickness of 0.3 mm is used, the amount of warpage of the wafer was 2.8 mm according to an experiment conducted by the present applicant, as shown in FIG. 1B.

The warpage as large as 2.8 mm results in an increase in height of the wafer (dimension in direction perpendicular to substrate surface having no warpage), and the wafer cannot therefore be accommodated in a wafer box. Further, when a manufacturing apparatus attempts to suck and handle the wafer, the curved wafer causes a gap between a sucker and the wafer, resulting in inappropriate sucking. That is, inter-step and inter-factory transportation and intra-apparatus transportation are hampered, resulting in a significant decrease in semiconductor wafer productivity.

As will be described later with reference to FIGS. 11A to 18B, in semiconductor wafer manufacturing steps in the present embodiment, an optical process (film formation step, removal step) is carried out in between a first-half semiconductor process and a second-half semiconductor process. The semiconductor wafer therefore needs to be transported between a semiconductor factory and an optics factory, and the inter-factory transportation in the description represents the transportation between the semiconductor factory and the optics factory.

On the other hand, JP-A-2000-352612, although disclosing a multilayer film optical filter, is not directed to a semiconductor wafer in the first place and therefore does not consider suppression of warpage.

Figure 2B:
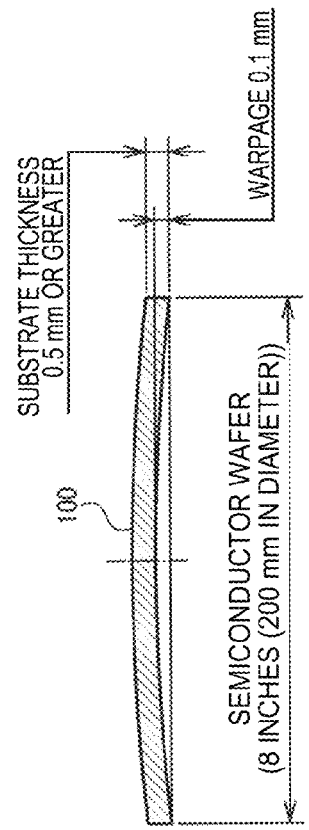
FIGS. 2A and 2B show an example of a semiconductor wafer according to an embodiment of the invention.
Figure 2A:
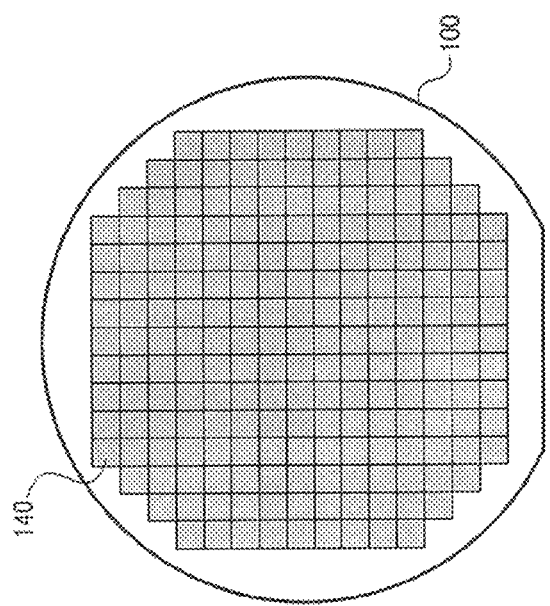

The present applicant therefore proposes a method for preventing large warpage, such as that described above, with no dedicated film provided or no other measures taken. Specifically, a semiconductor wafer according to the present embodiment has a semiconductor substrate 100, a dielectric multilayer film 110, which is formed on or above the semiconductor substrate 100 and serves as an optical filer in each light receiving sensor 140, and a light detection region 120 formed in the semiconductor substrate 100, as shown in FIGS. 2A and 2B, and the Poisson ratio VS of the semiconductor substrate 100, Young's modulus ES of the semiconductor substrate 100, the radius r of the semiconductor substrate 100, the thickness b of the semiconductor substrate 100, stress σ in the dielectric multilayer film 110, and the thickness d of the dielectric multilayer film 110 satisfy the relationship expressed by the following Expression (1).

$$1.0 \times 10^{-3} \geq \{3 \times r^2 \times d \times (1-VS) \times \sigma\}/(ES \times b^2) \quad (1)$$

As seen from the above description, the term "wafer (semiconductor wafer)" used herein is assumed to include an entire substrate on which a variety of films have been formed in a manufacturing process rather than referring to a semiconductor substrate alone. Further, FIGS. 2A and 2B only show the semiconductor substrate 100 and the light receiving sensors 140, but each of the light receiving sensors 140 includes a dielectric multilayer film 111 and a light detection region 121, as will be described later with reference to FIGS. 3 and 4 and other figures. That is, the semiconductor wafer includes the dielectric multilayer film 110, which is the assembly of the dielectric multilayer films 111 corresponding to the plurality of light receiving sensors 140 formed in the wafer, and the light detection region 120, which is the assembly of the light detection regions 121 corresponding to the plurality of light receiving sensors 140.

Further, the method according to the present embodiment is applicable not only to a semiconductor wafer but also to a light receiving sensor produced by dicing the semiconductor wafer. Specifically, the method according to the present embodiment is applicable to the light receiving sensor 140 produced by dicing a semiconductor wafer having the semiconductor substrate 100, the dielectric multilayer film 110 formed on or above the semiconductor substrate 100 and serving as an optical filer in each of the light receiving sensors 140, and the light detection region 120 formed in the semiconductor substrate 100 with the Poisson ratio VS of the semiconductor substrate 100, Young's modulus ES of the semiconductor substrate 100, the radius r of the semiconductor substrate 100, the thickness b of the semiconductor substrate 100, the stress σ in the dielectric multilayer film 110, and the thickness d of the dielectric multilayer film 110 satisfying the relationship expressed by Expression (1) described above.

The method, the principle of which will be described later with reference to FIG. 8 and other figures, allows the amount of warpage δ of the semiconductor wafer resulting from provision of the film on the semiconductor substrate to be reduced to 1.0 mm or smaller. An experiment conducted by the present applicant shows that when δ is 1.0 mm or smaller, the semiconductor wafer can be accommodated in a wafer box and sucked in a manufacturing apparatus. That is, setting the parameters in accordance with Expression (1) described above allows the semiconductor wafer to be appropriately manufactured without a decrease in productivity and provides other advantages.

An example of the structure of the semiconductor wafer according to the present embodiment will be described below, and the principle of the method according to the present embodiment will then be described. The steps of manufacturing the semiconductor wafer according to the present embodiment will finally be described.

2. Example of Structure of Semiconductor Wafer

Figure 3:
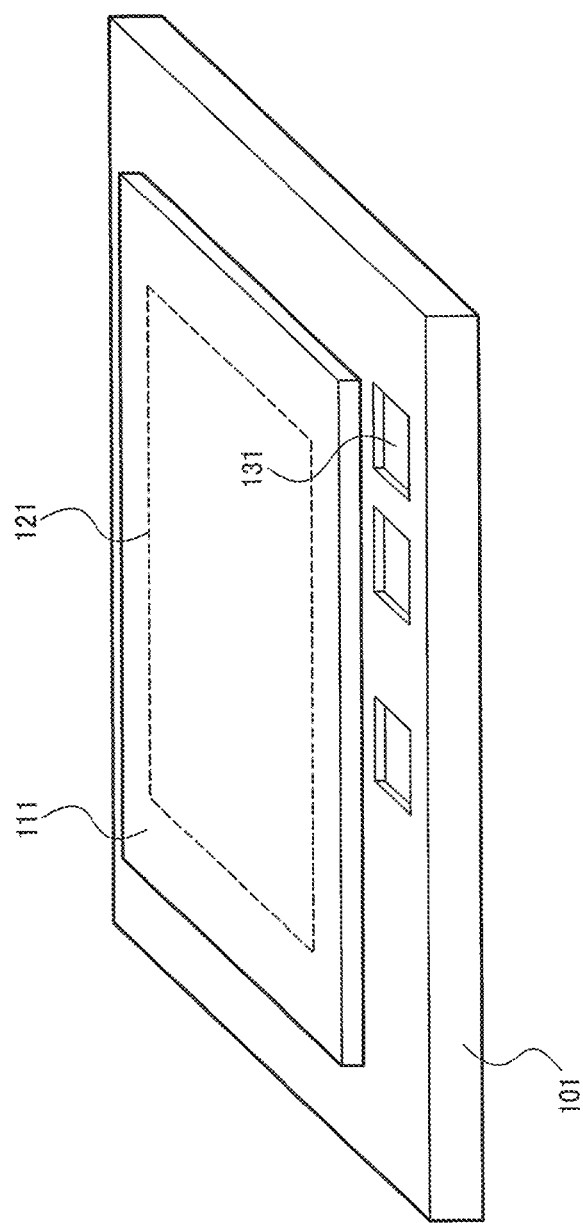
FIG. 3 is a perspective view of a light receiving sensor according to the present embodiment.
Figure 4:
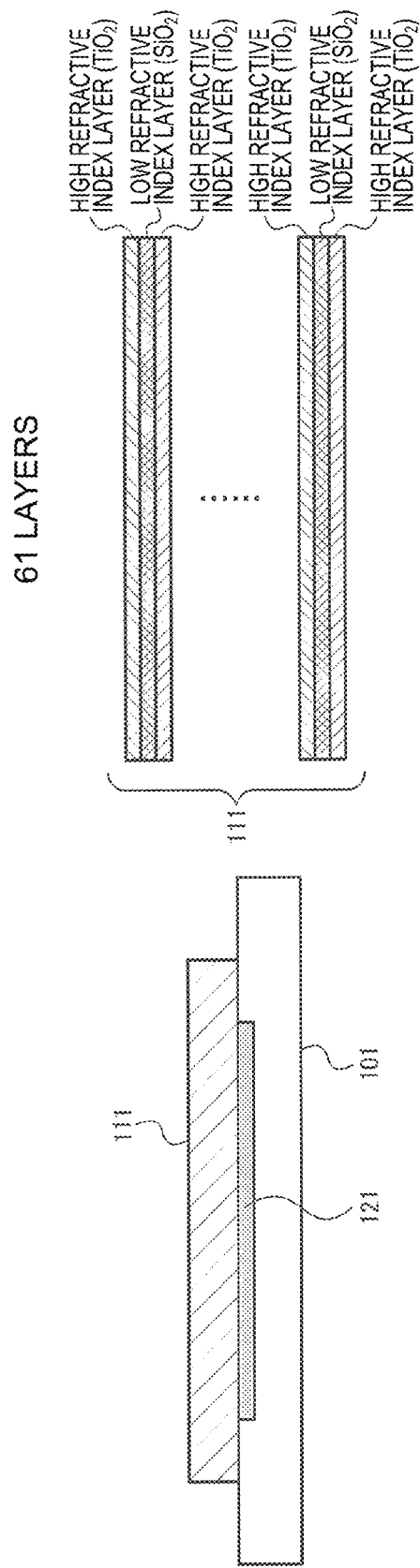
FIG. 4 is a cross-sectional view of the light receiving sensor and a dielectric multilayer film according to the present embodiment.

FIGS. 3 and 4 show an example of the configuration of one of the light receiving sensors 140 by cutting the semiconductor wafer according to the present embodiment in a dicing step. FIG. 3 is a perspective view of the light receiving sensor 140, and FIG. 4 is a cross-sectional view of the light receiving sensor 140. In FIG. 4, PAD electrodes 131 shown in FIG. 3 are omitted.

Each of the plurality of light receiving sensors 140 cut from the semiconductor wafer includes a semiconductor substrate 101, a dielectric multilayer film 111, a light detection region 121, and PAD electrodes 131, as shown in FIG. 3. The light detection region 121 in the description is, for example, a photodiode (PD), specifically, achieved by using a PN junction diode or any other structure. The wavelength range over which the light detection region 121 is sensitive, which changes in accordance with the doping concentration and other factors used when the PN junction is formed, is a wavelength band ranging, for example, from about 300 to 1100 nm.

The dielectric multilayer film 111 (multilayer film optical filter) is a film in which a first refractive index layer having a first refractive index and a second refractive index layer having a second refractive index smaller than the first refractive index are laminated on each other. The first refractive index layer (hereinafter referred to as high refractive index layer) may be a layer made of a titanium oxide (specifically, titanium dioxide $TiO_2$), and the second refractive index layer (hereinafter referred to as low refractive index layer) may be a layer made of a silicon oxide (specifically, silicon dioxide $SiO_2$), as shown in FIG. 4.

Considering that the dielectric multilayer film 111 performs optical processing, it is preferable that a point where the refractive index changes is provided on a given path (optical path). In this case, the interface between the high refractive index layer and the low refractive index layer serves as the refractive index changing point. That is, when the high refractive index layer and the low refractive index layer are laminated on each other, it is preferable that the high refractive index layer and the low refractive index layer are alternately laminated on each other multiple times, as shown in FIG. 4. Provided that the semiconductor substrate 100 has no warpage, the high refractive index layers and the low refractive index layers are alternately laminated on each other along the direction perpendicular to (substantially perpendicular to) the substrate. In FIG. 4 and other figures, since the layers at both ends in the lamination direction are high refractive index layers, the number of laminated layers is an odd number (61, for example), but the number is not limited to an odd number.

Further, the dielectric multilayer film 111 is a film that forms as a bandpass filter. A laminate of the high refractive index layers made of $TiO_2$ and the low refractive index layers made of $SiO_2$ described above is known to block light of a predetermined wavelength band. Specifically, a laminate of about 20 high and low refractive index layers in total can block light of a wavelength bandwidth of about 200 nm.

In the present embodiment, a bandpass filter having a desired pass band is achieved by using the dielectric multilayer film 111 that blocks wavelength bands on both sides of the pass band. For example, when the pass band ranges from 500 to 600 nm, the dielectric multilayer film 111 may be configured to block wavelength bands ranging from 300 to 500 nm and from 600 to 1100 nm. The blocked wavelength bands correspond to a cutoff characteristic of blocking ultraviolet and blue light (300 to 500 nm), red light (600 to 700 nm), and infrared light (700 to 1100 nm). In this case, all the layers that form the dielectric multilayer film 111 are not necessarily have the characteristic of blocking 300 to 500 nm and 600 to 1100 nm, but it may be conceivable that the dielectric multilayer film 111 are divided into several groups.

Specifically, the dielectric multilayer film 111 is an optical filter having a first group of refractive index layers and a second group of refractive index layers with the first group of refractive index layers attenuating a first frequency band, the second group of refractive index layers attenuating a second frequency band, and a third frequency band between the first frequency band and the second frequency band serving as the pass band.

For example, 20 of the layers in the dielectric multilayer film 111 are used to block light of 300 to 500 nm. In this case, the 20 layers form the first group of refractive index layers described above, and the first frequency band ranges from 300 to 500 nm. Further, 40 of the layers in the dielectric multilayer film 111 are used to block light of 600 to 1100 nm. In this case, the 40 layers form the second group of refractive index layers described above, and the second frequency band ranges from 600 to 1100 nm. In this case, the third frequency band ranges from 500 to 600 nm.

Each of the first and second groups is not formed only of 20 or 40 high or low refractive index layers but includes both the high and low refractive index layers (alternately laminated in a narrow sense). It may also be conceivable that the second refractive index layers are further be divided into groups. For example, 20 of the layers that form the second group of refractive index layers may be used to block (attenuate) light of 600 to 800 nm, and the other 20 of the layers that form the second group of refractive index layers may be used to block light of 800 to 1100 nm.

A highly precise bandpass filter can thus be achieved. A color filter provided on an image sensor (imaging sensor) in a digital camera or any other imaging apparatus is also a bandpass filter that has a specific visible wavelength pass band, but the precision of the color filter is very low. The reason for this is that since the image sensor converts a received light signal into an image and presents the image to a user, and even when the image sensor receives light of a wavelength band that does not fall within a desired wavelength band, the unwanted wavelength band does not greatly change an output image and human eyes, in particular, are unlikely to detect the change. It is assumed that the light receiving sensor according to the present embodiment includes a more precise bandpass filter that lowers the magnitude of a signal passing through a blocked band, for example, to about ¹⁄₁₀₀ to ¹⁄₁₀₀₀₀ or smaller. To this end, a dielectric multilayer film in which a large number of layers having different refractive indices are laminated on each other as described above may be used.

The dielectric multilayer film 111 on each of the light receiving sensors 140 has been described above, and the above description is also applicable to the dielectric multilayer film 110 on or above the semiconductor wafer because the dielectric multilayer film 110 on or above the semiconductor wafer is the assembly of the dielectric multilayer films 111 on or above the light receiving sensors 140.

Figure 5:
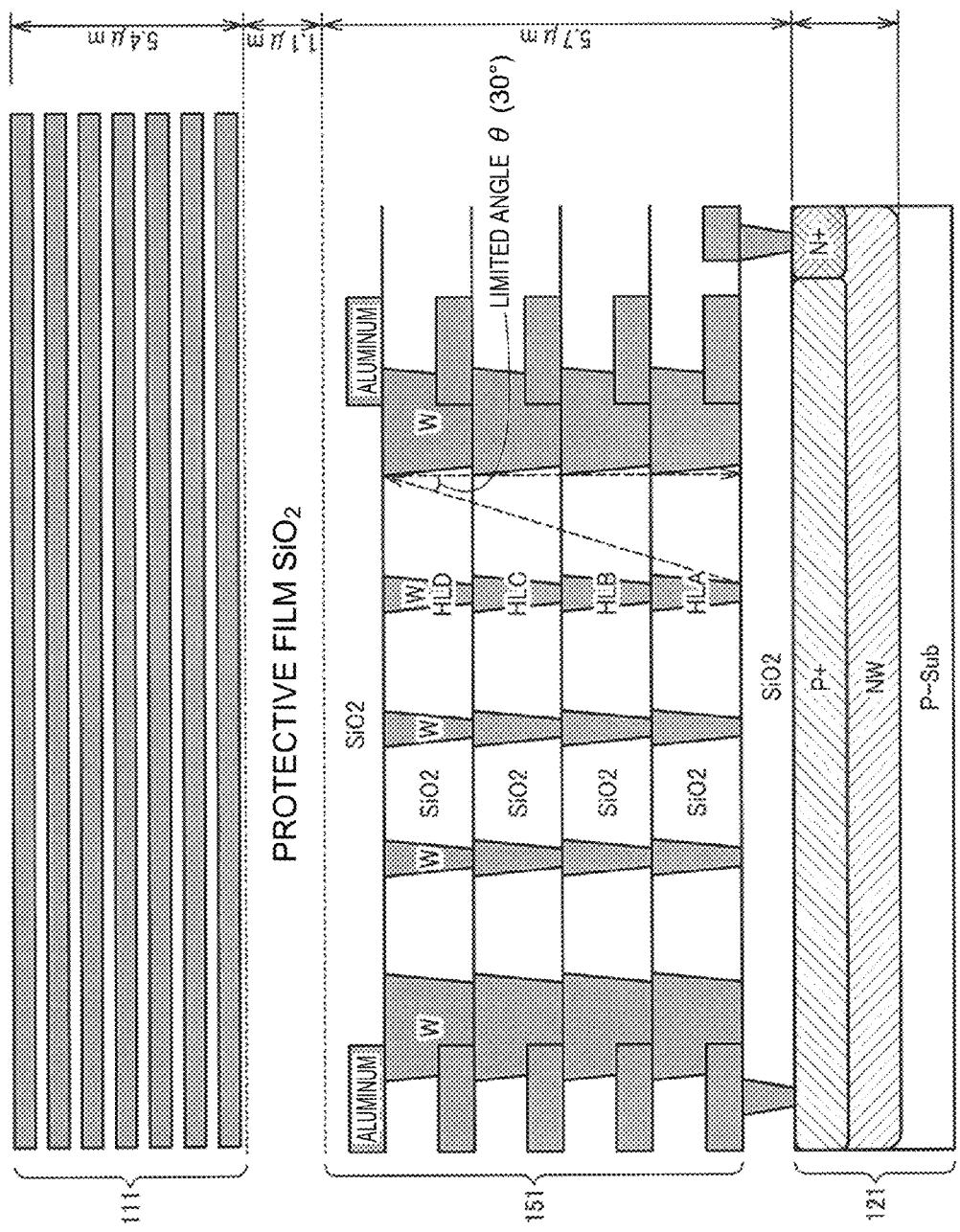
FIG. 5 is a cross-sectional view in a case where an angle limiting filter is provided in the light receiving sensor.
Figure 6A:
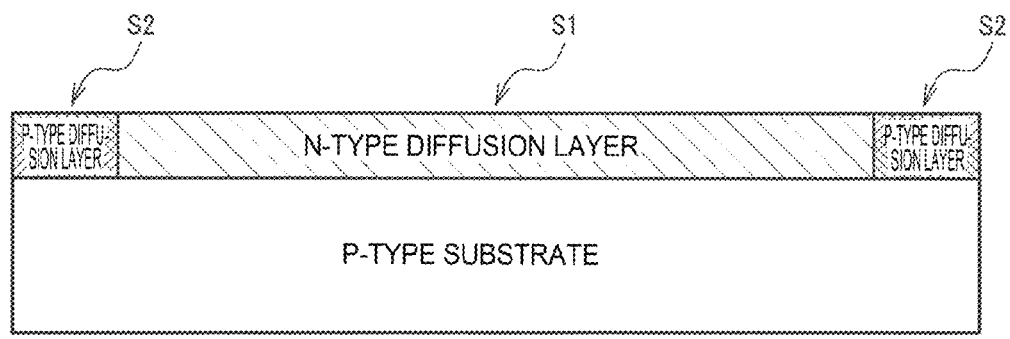
FIGS. 6A and 6B describe some of the steps of forming the angle limiting filter.

An angle limiting filter 151 may be provided between the dielectric multilayer film 111 and the light detection region 121, as shown in FIG. 5. FIGS. 6A to 7 show an example of the steps of forming the angle limiting filter 151.

An N-type diffusion layer (impurity region of photodiode) is first formed on a P-type substrate in a photolithography step, an ion implantation step, and a photoresist stripping step, as labeled with S1 in FIG. 6A. A P-type diffusion layer is formed on the P-type substrate in a photolithography step, an ion implantation step, a photoresist stripping step, and a heat treatment step, as labeled with S2. The N-type diffusion layer forms the cathode of the photodiode, and the P-type diffusion layer (P-type substrate) forms the anode of the photodiode.

Figure 6B:
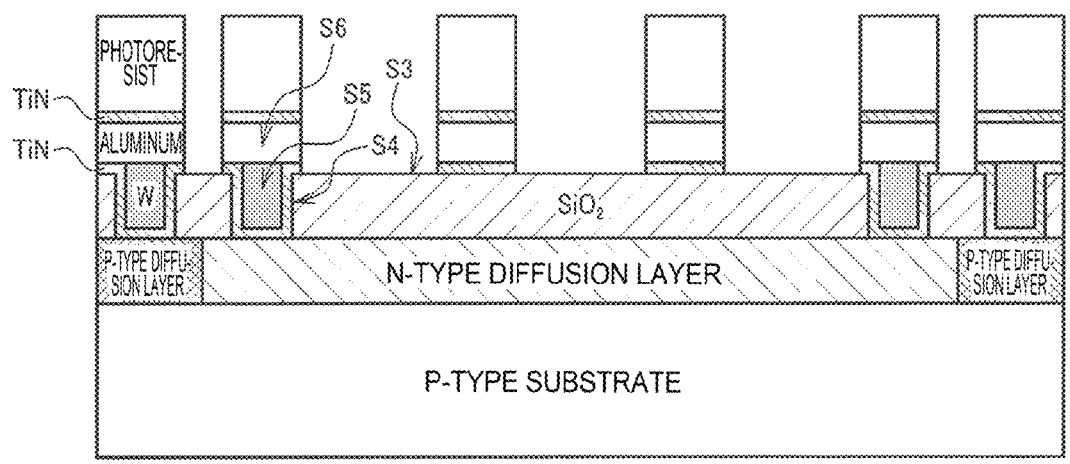
Figure 7:
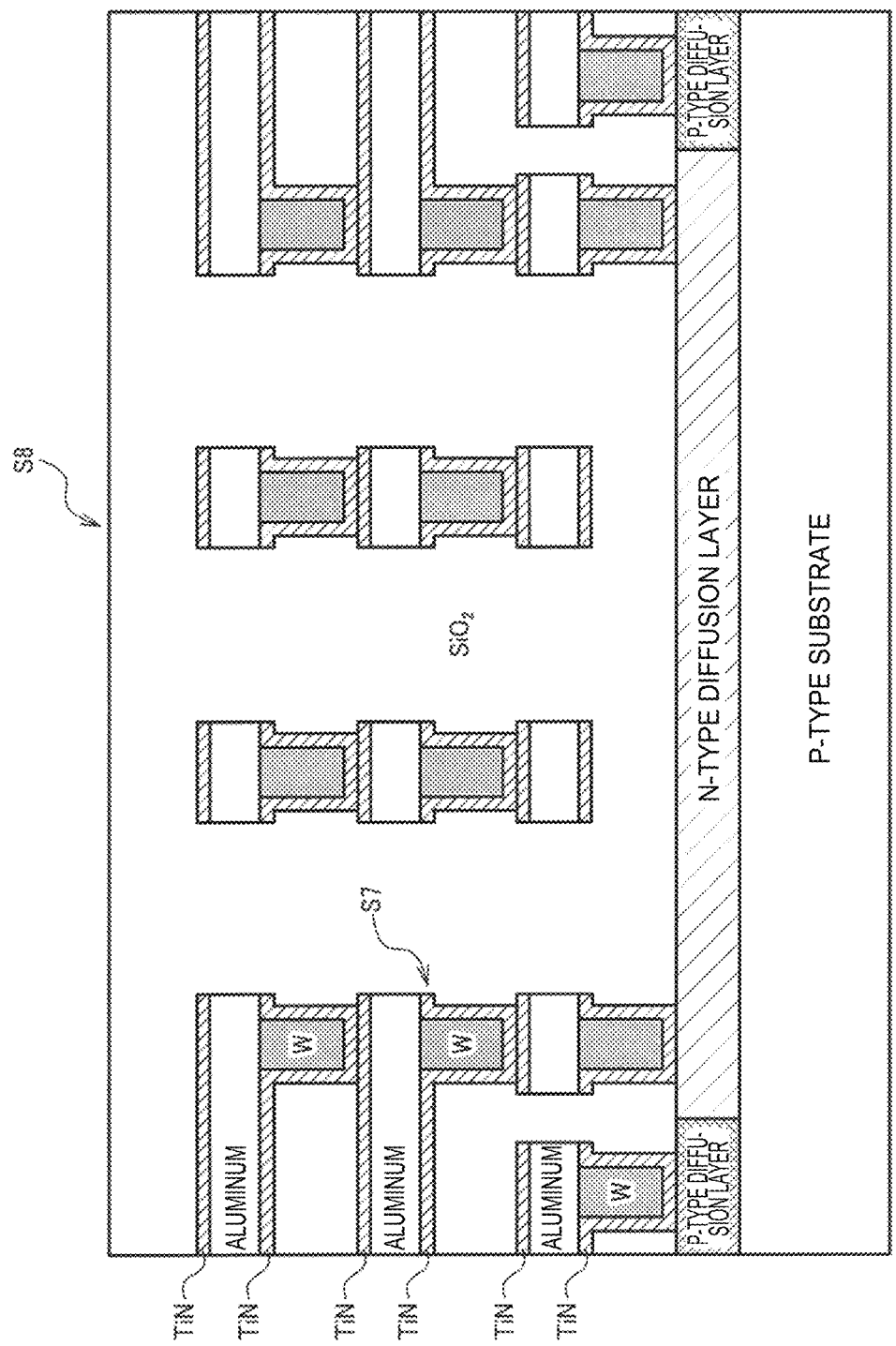
FIG. 7 describes one of the steps of forming the angle limiting filter.

An insulating film is then formed in a $SiO_2$ deposition step and a planarization step based on polishing (CMP (chemical mechanical polishing), for example), as labeled with S3 in FIG. 6B. Contact holes are formed in a photolithography step, an $SiO_2$ anisotropic dry etching step, and a photoresist stripping step, as labeled with S4. The contact holes are buried in a TiN (titanium nitride) sputtering step, a W (tungsten) deposition step, and a W etching back step, as labeled with S5. First-stage aluminum wiring is formed in an aluminum sputtering step, a TiN sputtering step, a photolithography step, an aluminum and TiN anisotropic dry etching step, and a photoresist stripping step, as labeled with S6.

Via contacts and second-stage aluminum wiring are then formed in the same steps as steps S3 to S6 described above, as labeled with S7 in FIG. 7. Thereafter, step S7 is repeated necessary multiple times. FIG. 7 shows a case where the aluminum wiring is formed up to a third stage. An insulating film is further formed in an $SiO_2$ deposition step and a CMP planarization step, as labeled with S8. The wiring formation steps described above provide a laminate formed of aluminum wiring lines and tungsten plugs that form the angle limiting filter. The angle limiting filter 151 shown in FIG. 5 is an example in which the aluminum wiring is formed up to a fifth stage, and a variety of changes can be made to the configuration of the angle limiting filter 151 as long as the condition on an angle θ, which will be described later, is satisfied.

The thus provided tungsten plugs labeled with W in FIG. 5 limit the angle θ to 30 degrees at maximum. As a result, light to be incident on the light detection region 121 can be so handled as shown in FIG. 5 that light having an angle of incidence (angle with respect to direction perpendicular to surface of light detection region) smaller than 30 degrees reaches the light detection region 121 but light having an angle of incidence of 30 degrees or greater does not reach the light detection region 121 (is blocked by tungsten plugs before reaching light detection region 121).

Each of the high and low refractive index layers that form the dielectric multilayer film 111 (110) described above has internal stress. The high refractive index layers present stress that concavely deforms the substrate, whereas the low refractive index layers present stress that convexly deforms the substrate. Since the low refractive index layers present larger stress than the high refractive index layers, the substrate is warped convexly. Since a greater number and a wider area of layers of the film result in a larger amount of warpage of the substrate, using the dielectric multilayer film in the present embodiment having, for example, as many as 61 layers results in a large amount of warpage. When the semiconductor substrate 100 has a typical radius and thickness, the amount of warpage is about 2.8 mm, as shown in Comparative Example in FIGS. 1A and 1B. The term "convex" used herein refers to a state in which a central portion of the semiconductor substrate 100 protrudes toward the front surface side of the semiconductor substrate 100 with respect to the periphery thereof (toward the side of the semiconductor substrate 100 on which the dielectric multilayer film 110 and the light detection region 120 are formed). Similarly, the term "concave" used herein refers to a state in which the central portion of the semiconductor substrate 100 protrudes toward the rear surface side of the semiconductor substrate 100 with respect to the periphery thereof (toward the side opposite to the front surface side described above).

3. Principle

In contrast, in the present embodiment, warpage is suppressed by appropriately setting the relationship among some parameters. The principle of the method according to the present embodiment will be described below. Thereafter, applicability of the principle to the present embodiment will be examined by using actual measurements, and specific examples of the parameters that allow suppression of warpage will be presented.

The amount of warpage of a substrate (semiconductor substrate 100) on which the dielectric multilayer film 110 is formed is generally expressed the following Stoney's formula (2).

$$R = ES \times b^2 / \{6 \times d(1-VS) \times \sigma\} \quad (2)$$

In Expression (2), R represents the radius of curvature of the warped substrate. ES, VS, b, d, and σ are the same parameters as those in Expression (1) described above.

Figure 8:
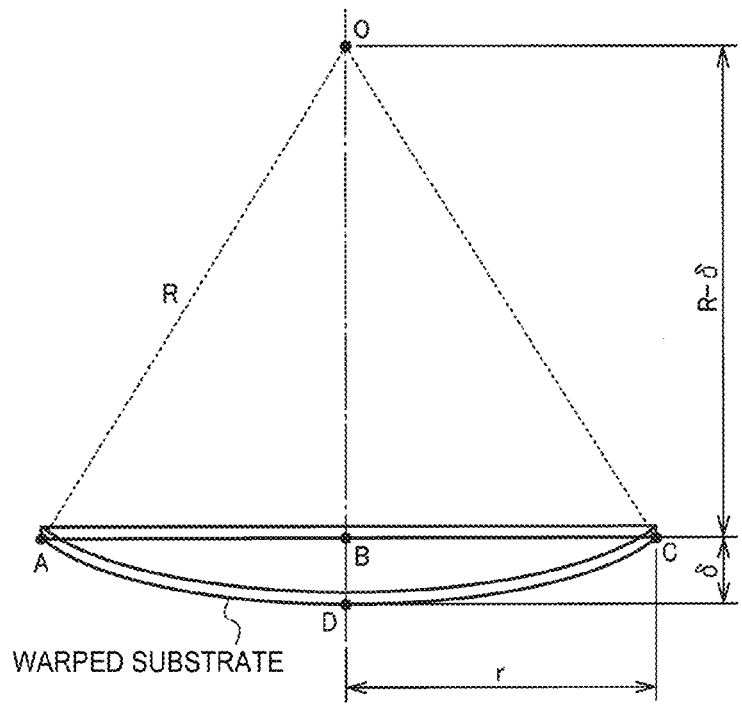
FIG. 8 describes the principle of a method according to the present embodiment.

The radius of curvature R of the substrate, the radius r of the substrate, and the difference R−δ between R and the amount of warpage δ of the substrate form the three sides of a right-angled triangle, as shown in FIG. 8. The three parameters therefore satisfy the following Expression (3), which is transformed into the following Expression (4). Considering that 2R>>δ, Expression (4) can be approximated to the following Expression (5), and the following Expression (6) can be derived by transforming Expression (5).

$$R^2 - r^2 = (R-\delta)^2 \quad (3)$$

$$r^2 = \delta(2R-\delta) \quad (4)$$

$$r^2 \approx 2R\delta \quad (5)$$

$$R \approx r^2/2\delta \quad (6)$$

Further, Expressions (2) and (6) are used to eliminate R to derive the following Expression (7).

$$\delta = \{3 \times r^2 \times d \times (1-VS) \times \sigma\} / (ES \times b^2) \quad (7)$$

As described above, an experiment conducted by the present applicant shows that when the amount of warpage of the substrate is 1 mm ($1 \times 10^{-3}$ [m]) or smaller, the substrate can be inserted into a wafer box and sucked in an apparatus. That is, $\delta \leq 1.0 \times 10^{-3}$ and Expression (7) can derive the relationship expressed by Expression (1) described above.

Consider now a case where a silicon substrate is used as the semiconductor substrate 100. Young's modulus ES and the Poisson ratio VS of a silicon substrate are known to be $ES=16 \times 10^{10}$ (N/m$^2$) and $VS=0.264$, respectively. Using the numerical values allows transformation of Expression (7) described above into the following Expression (8), and the following Expression (9) can be derived as an expression that corresponds to Expression (1) described above and achieves the amount of warpage of the substrate of 1 mm or smaller.

$$\delta = 0.138 \times 10^{-10} \times r^2 \times d \times \sigma / b^2 \quad (8)$$

$$1 \times 10^{-3} \geq 0.138 \times 10^{-10} \times r^2 \times d \times \sigma / b^2 \quad (9)$$

Figure 1A:
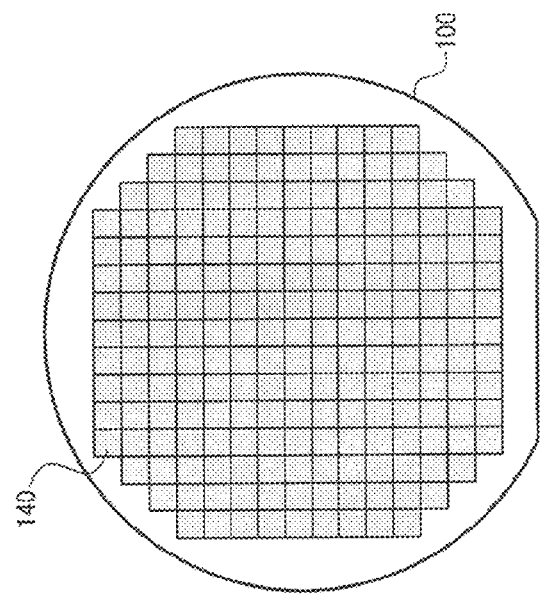

In Comparative Example described with reference to FIGS. 1A and 1B, the semiconductor substrate 100 has a radius r of 200 mm and a thickness b of 0.3 mm. Substituting the two parameters and the thickness d and the stress σ corresponding to the dielectric multilayer film 110 described above with reference to FIG. 4 and other figures into Expression (8) described above results in $\delta = 2.8 \times 10^{-3}$. That is, Expression (8) provides a value that agrees with the measured value.

Figure 9:
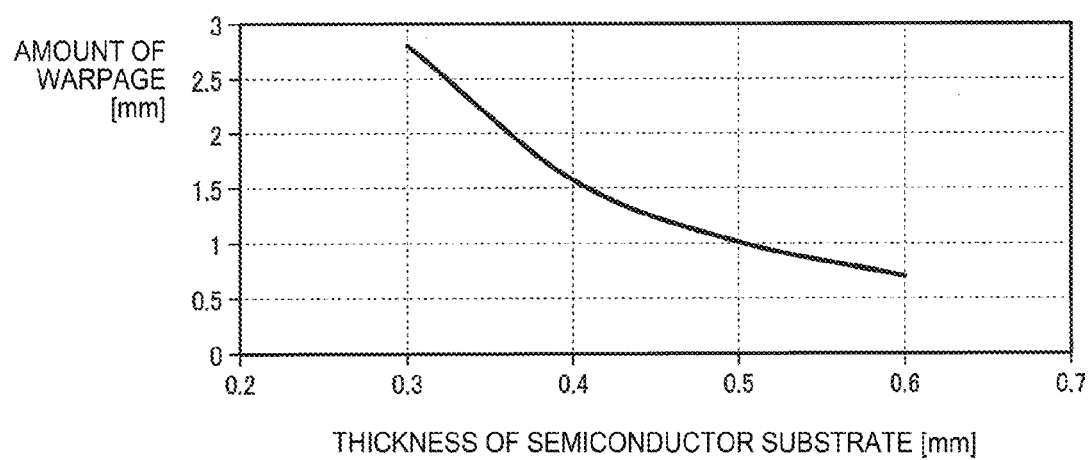
FIG. 9 is a graph representing the relationship between the thickness of a semiconductor substrate and the amount of warpage of the semiconductor wafer.

Further, in a state in which the semiconductor substrate 100 has a fixed radius of 200 mm and the dielectric multilayer film 110 also has fixed conditions, FIG. 9 shows the amount of warpage of the wafer measured when the thickness of the semiconductor substrate 100 is changed from 0.3 to 0.6 mm. In FIG. 9, the horizontal axis represents the thickness of the semiconductor substrate 100, and the vertical axis represents the amount of warpage of the wafer.

The graph shown in FIG. 9 precisely agrees with a graph representing the relationship between δ and b in a case where the values of the parameters described above are substituted into r, d, and σ in Expression (8) described above. That is, Expression (8) is an appropriate expression representing the amount of warpage δ of the wafer, and the amount of warpage of the wafer can be reduced to fall within an appropriate range (1.0 mm or smaller) by using Expression (9) described above derived from Expression (8).

Specifically, at least one of the radius r of the semiconductor substrate 100, the thickness b of the semiconductor substrate 100, the stress σ in the dielectric multilayer film 110, and the thickness d of the dielectric multilayer film 110 may be variably so set that Expression (9) is satisfied.

For example, under the fixed conditions described above that the dielectric multilayer film 110 is made of TiO$_2$ and SiO$_2$ and blocks light of 300 to 500 nm and 600 to 1100 nm, the thickness d of the dielectric multilayer film 110 is determined. Further, when the area of the dielectric multilayer film 110 to be provided is determined based on design of the semiconductor wafer, the stress σ in the dielectric multilayer film 110 is also determined. In this case, since d and σ in Expression (9) described above are constants, the radius r and the thickness b of the semiconductor substrate 100 may be so determined that Expression (9) is satisfied. Further, when the radius r of the semiconductor wafer is also fixed as shown in FIG. 9, Expression (9) can be rearranged by isolating b, and the range of the thickness of the semiconductor substrate 100 can be so determined that the amount of warpage falls within the appropriate range.

It is, however, noted that when the thickness, the area, and other parameters of the dielectric multilayer film 110 can be changed, r, b, σ, and d can all be variably set, and part of the parameters can be variably set in a variety of manners. As an example, when any of the parameters is difficult to change from a design viewpoint or has high priority and is preferably set at a specific value, the parameter may be set at a desirable fixed value, and the other parameters may be variably so set that Expression (9) described above is satisfied.

4. Steps of Manufacturing Semiconductor Wafer

Steps of manufacturing the semiconductor wafer will next be described with reference to FIGS. 10A to 18B. FIG. 10A is a top view (plan view) of the semiconductor wafer according to the present embodiment, as described above with reference to FIG. 2A and other figures, and FIG. 10B is an enlarged view of a portion corresponding to one of the light receiving sensors 140 in the semiconductor wafer. In the following figures, the one light receiving sensor 140 and regions therearound are shown in cross-sectional views taken along the lines X-X' and Y-Y'.

Figure 11A:
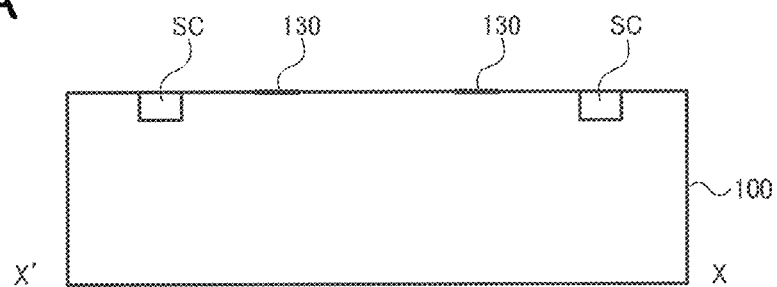
FIGS. 11A and 11B describe the step of forming a light detection region.
Figure 11B:
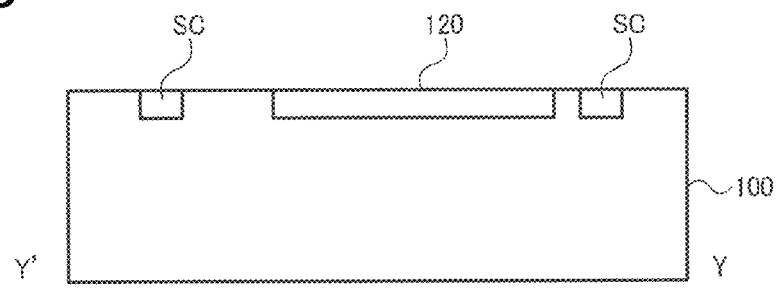

In the steps of manufacturing the semiconductor wafer, the first-half semiconductor process first is carried out. Specifically, the light detection region 120 and the PAD electrodes 130 are formed in the semiconductor substrate 100, as shown in FIGS. 11A and 11B. FIG. 11A is a cross-sectional view taken along the line X-X', and FIG. 11B is a cross-sectional view taken along the line Y-Y'. The light detection region 120 (photodiode) may be formed, for example, by using the method described above with reference to FIG. 6A.

Figure 12A:
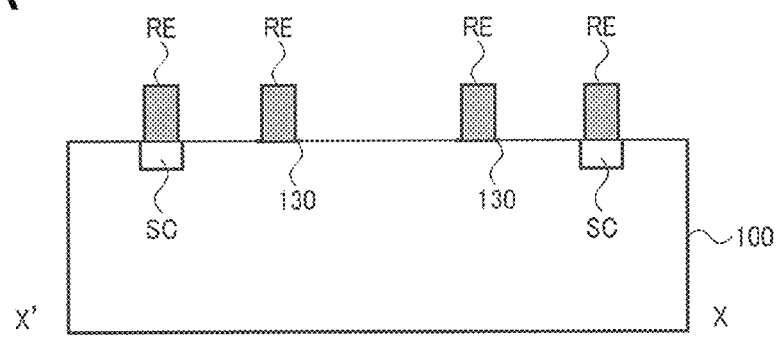
FIGS. 12A and 12B describe a resist application step.
Figure 12B:
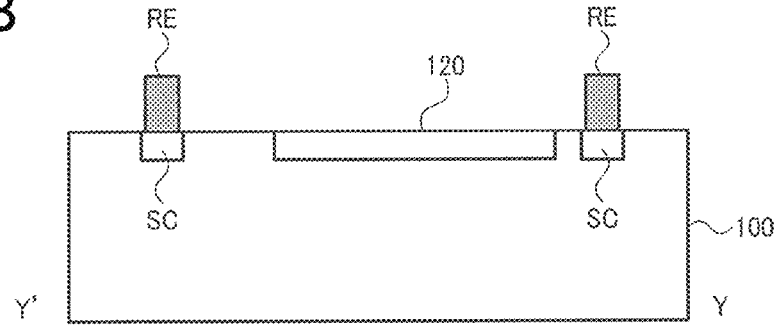

After the first-half semiconductor process, a film formation step of forming the dielectric multilayer film 110 is carried out. Specifically, as a preparatory stage, a resist RE is applied onto a region where the dielectric multilayer film 110 is desired not to be formed, as shown in FIGS. 12A and 12B. The region where the dielectric multilayer film 110 is desired not to be formed is not only a scribe region (a region where the substrate is cut in a dicing step, which will be described later, and which corresponds, for example, to a scribe line: SC in FIGS. 10A and 10B and other figures) but also regions corresponding to the PAD electrodes 130.

Figure 13A:
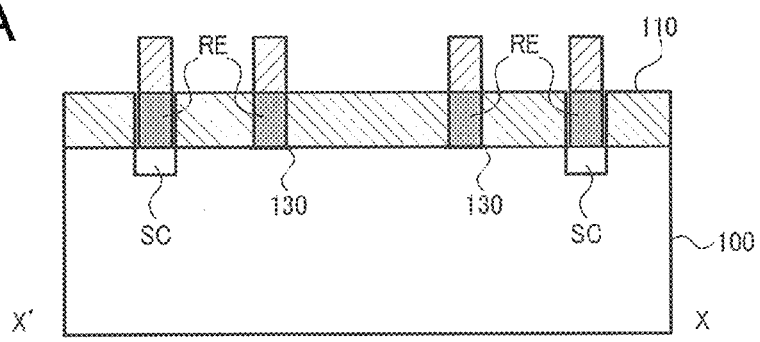
FIGS. 13A and 13B describe a film formation step.
Figure 13B:
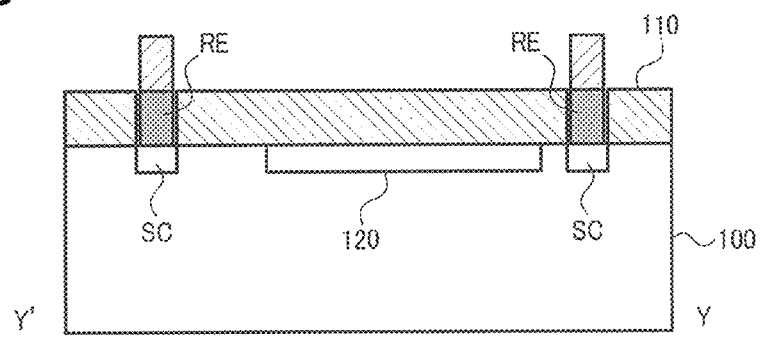

The film formation step of forming the dielectric multilayer film 110 in an evaporation process is then carried out, as shown in FIGS. 13A and 13B. For example, $TiO_2$ (titanium oxide film) sputtering and $SiO_2$ sputtering are alternately performed to form a multilayer thin film.

Figure 14A:
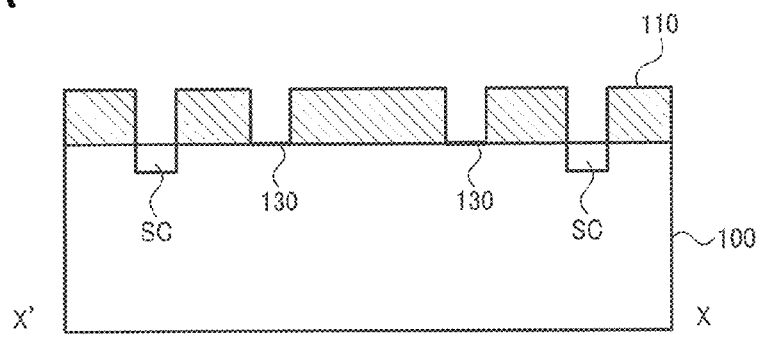
FIGS. 14A and 14B describe a removal (liftoff) step.
Figure 14B:
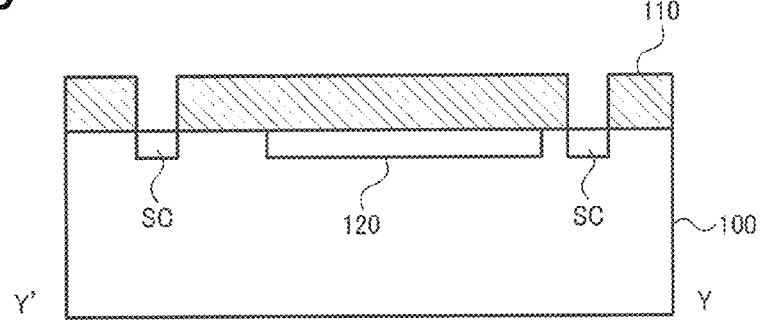

After the film formation step, a removal step of removing the dielectric multilayer film 110 present in the scribe region of the light receiving sensor 140 is carried out. The removal step may be a liftoff process of causing an etchant to flow through corner portions of the dielectric multilayer film 110 where it is thin to dissolve the resist RE so as to remove the dielectric multilayer film 110 formed on the resist RE in the evaporation process, as shown in FIGS. 14A and 14B.

It is noted that the liftoff process is not required when an unnecessary portion of the dielectric multilayer film 110 only needs to be merely removed. Specifically, the resist RE or any other material is not required in the film formation step, but a typical evaporation step may be carried out with no resist RE. Thereafter, a necessary portion of the dielectric multilayer film 110 may be covered with a resist, and an unnecessary portion of the dielectric multilayer film 110 may be etched away. However, the dielectric multilayer film 110 made of $TiO_2$ used in the present embodiment is very hard, and it is therefore difficult to remove the unnecessary portion in a typical etching process. In the description, the removal step is therefore carried out by using the liftoff process. In the liftoff process, the resist RE is lifted and the dielectric multilayer film 110 unnecessarily formed on the resist RE is removed, whereby the removal can be performed irrespective of the hardness of the dielectric multilayer film 110.

Figure 15A:
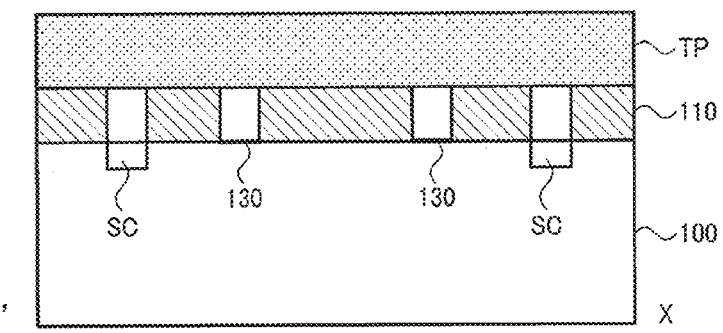
FIGS. 15A and 15B describe a protective tape attachment step.
Figure 15B:
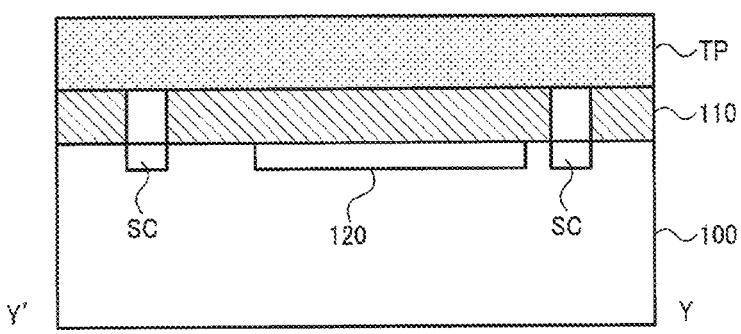

After the removal step, the second-half semiconductor process is carried out. Specifically, a protective tape TP is first attached to the surface of the wafer (surface on which dielectric multilayer film 110 and light detection region 120 are formed), as shown in FIGS. 15A and 15B.

Figure 16A:
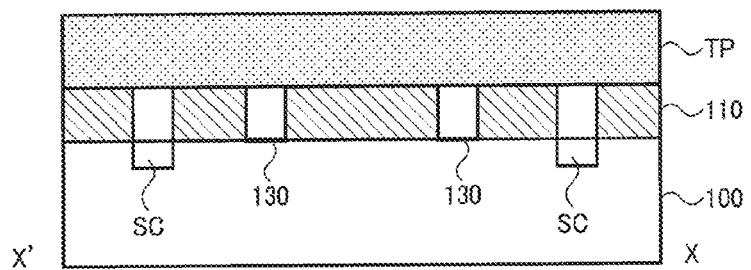
FIGS. 16A and 16B describe a rear surface grinding step.
Figure 16B:
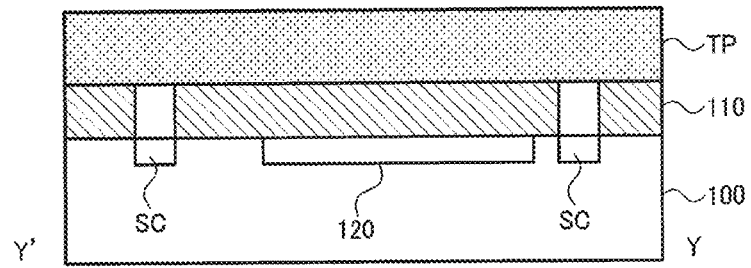

Thereafter, to reduce the weight and thickness of the wafer, the rear surface of the wafer is ground, as shown in FIGS. 16A and 16B. A DAF (die attach film) is then attached to the rear surface of the wafer, and the wafer is fixed to a dicing frame FR, followed by removal of the protective tape TP on the front surface. FIGS. 17A and 17B show the attachment of the DAF, and FIGS. 17C and 17D show the fixation of the wafer to the dicing frame FR. FIGS. 17E and 17F show the state in which the protective tape TP has been removed.

A situation in which the semiconductor wafer has a large amount of warpage and cannot therefore be handled in an apparatus occurs, for example, in any of the states shown in FIGS. 17A to 17F. At this point, since the dielectric multilayer film 110 has been formed, the stress therein convexly warps the wafer. The semiconductor wafer cannot therefore be sucked well in the apparatus, and the step of attaching the DAF, fixing the wafer to the dicing frame FR, or stripping the protective tape TP cannot be carried out. In this regard, the method according to the present embodiment described above allows the warpage to be suppressed, whereby the steps in FIGS. 17A to 17F can be appropriately carried out.

Figure 18A:
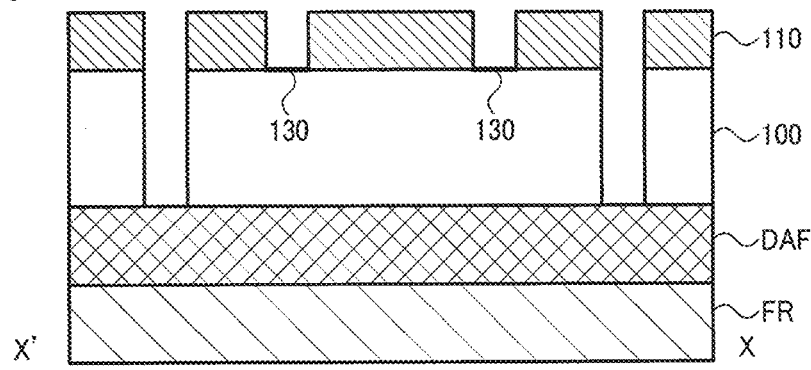
FIGS. 18A and 18B describe a dicing step.
Figure 18B:
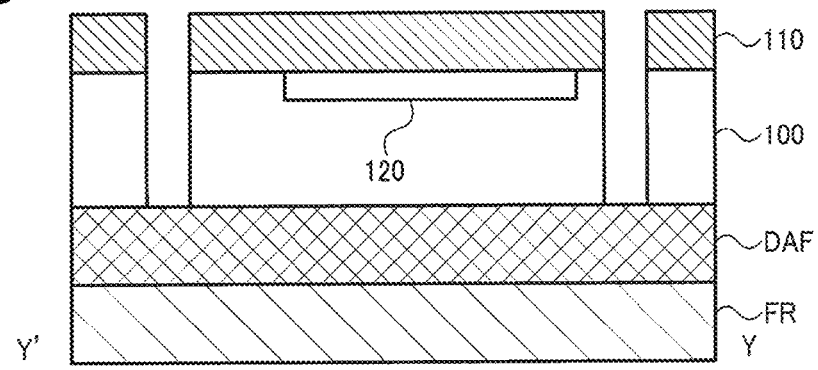

Finally, the semiconductor substrate 100 is cut in a dicing process along the scribe region SC into the light receiving sensors 140, as shown in FIGS. 18A and 18B.

The method according to the present embodiment described above is also applicable to a method for manufacturing the light receiving sensor 140. Specifically, the method for manufacturing the light receiving sensor according to the present embodiment includes the step of forming the light detection region 120 in the semiconductor substrate 100, the film formation step of forming the dielectric multilayer film 110, which serves as an optical filter on the light receiving sensor 140, on the semiconductor substrate 100, and the dicing step of cutting the semiconductor substrate 100 on which the dielectric multilayer film 110 is formed in a dicing process into the light receiving sensors 140, with the Poisson ratio VS of the semiconductor substrate 100, Young's modulus ES of the semiconductor substrate 100, the radius r of the semiconductor substrate 100, the thickness b of the semiconductor substrate 100, the stress σ in the dielectric multilayer film 110, and the thickness d of the dielectric multilayer film 110 satisfying Expression (1) described above.

The step of forming the light detection region 120 corresponds to the step in FIGS. 11A and 11B. The film formation step corresponds to the step in FIGS. 13A and 13B. The dicing step corresponds to the step in FIGS. 18A and 18B. A variety of variations are conceivable, for example, the step in FIGS. 12A and 12B, which is the film formation preparatory stage, can be integrated with the film formation step, and the steps in FIGS. 15A and 17F, which are the dicing preparatory stage, can be integrated with the dicing step.

Suppressing warpage of the semiconductor wafer as described above allows the light receiving sensors 140 to be manufactured without a decrease in productivity and provides other advantages.

The present embodiment has been described above in detail, and a person skilled in the art will readily appreciate that a large number of variations are conceivable to the extent that they do not substantially depart from the novel items and advantageous effects of the invention. Such variations are all therefore assumed to fall within the scope of the invention. For example, a term described at least once in the specification or the drawings along with a different term having a boarder meaning or the same meaning can be replaced with the different term anywhere in the specification or the drawings. Further, the configuration and operation of each of the semiconductor wafer and other components are not limited to those described in the present embodiment, and a variety of changes can be made thereto.

What is claimed is:

1. A semiconductor wafer comprising:
a semiconductor substrate;
a dielectric multilayer film formed above the semiconductor substrate and serving as an optical filter of a light receiving sensor; and
a light detection region formed in the semiconductor substrate,
wherein the Poisson ratio VS of the semiconductor substrate, Young's modulus ES of the semiconductor substrate, the radius r of the semiconductor substrate, the thickness b of the semiconductor substrate, stress σ in the dielectric multilayer film, and the thickness d of the dielectric multilayer film satisfy a relationship expressed by the following Expression (1):

$$1.0 \times 10^{-3} \geq \{3 \times r^2 \times d \times (1-VS) \times \sigma\}/(ES \times b^2) \tag{1}$$

wherein the dielectric multilayer film comprises a first group of refractive index layers and a second group of refractive index layers with the first group of refractive index layers attenuating a first frequency band and the second group of refractive index layers attenuating a second frequency band, wherein a third frequency band between the first frequency band and the second frequency band is a pass band of the optical filter; and
wherein the first group of refractive index layers and the second group of refractive index layers are each comprised of 20 to 40 layers.

2. The semiconductor wafer according to claim 1, wherein the dielectric multilayer film is a film in which a first refractive index layer having a first refractive index and a second refractive index layer having a second refractive index smaller than the first refractive index are laminated.

3. The semiconductor wafer according to claim 2, wherein the first refractive index layer is a layer made of a titanium oxide, and
the second refractive index layer is a layer made of a silicon oxide.

4. The semiconductor wafer according to claim 1, wherein the dielectric multilayer film is a film that forms a bandpass filter.

5. The semiconductor wafer according to claim 1, wherein the radius r of the semiconductor substrate, the thickness b of the semiconductor substrate, the stress σ in the dielectric multilayer film, and the thickness d of the dielectric multilayer film satisfy a relationship expressed by the following Expression (2):

$$1.0 \times 10^{-3} \geq 0.138 \times 10^{-10} \times r^2 \times d \times \sigma / b^2 \tag{2}$$

6. The semiconductor wafer according to claim 1, wherein at least one of the radius r of the semiconductor substrate, the thickness b of the semiconductor substrate, the stress σ in the dielectric multilayer film, and the thickness d of the dielectric multilayer film is variably so set that Expression (1) is satisfied.

7. A method for manufacturing a light receiving sensor, the method comprising:
forming a light detection region in a semiconductor substrate;
forming a dielectric multilayer film above the semiconductor substrate, the dielectric multilayer film serving as an optical filter of a light receiving sensor, wherein the dielectric multilayer film comprises a first group of refractive index layers and a second group of refractive index layers with the first group of refractive index layers attenuating a first frequency band and the second group of refractive index layers attenuating a second frequency band, wherein a third frequency band between the first frequency band and the second frequency band is a pass band of the optical filter, and wherein the first group of refractive index layers and the second group of refractive index layers are each comprised of 20 to 40 layers; and
dicing the semiconductor substrate above which the dielectric multilayer film has been formed to cut the light receiving sensor out of the semiconductor substrate,
wherein the Poisson ratio VS of the semiconductor substrate, Young's modulus ES of the semiconductor substrate, the radius r of the semiconductor substrate, the thickness b of the semiconductor substrate, stress σ in the dielectric multilayer film, and the thickness d of the dielectric multilayer film satisfy a relationship expressed by the following Expression (3):

$$1.0 \times 10^{-3} \geq \{3 \times r^2 \times d \times (1-VS) \times \sigma\}/(ES \times b^2) \tag{3}$$

8. The method for manufacturing a light receiving sensor according to claim 7, further comprising
removing the dielectric multilayer film present in a scribe region of the light receiving sensor after the forming of the dielectric multilayer film but before the dicing.

9. The method for manufacturing a light receiving sensor according to claim 8,
wherein the removing is a liftoff process.

10. A light receiving sensor produced by dicing a semiconductor wafer, the semiconductor wafer including
a semiconductor substrate,
a dielectric multilayer film formed above the semiconductor substrate and serving as an optical filter of a light receiving sensor, wherein the dielectric multilayer film comprises a first group of refractive index layers and a second group of refractive index layers with the first group of refractive index layers attenuating a first frequency band and the second group of refractive index layers attenuating a second frequency band, wherein a third frequency band between the first frequency band and the second frequency band is a pass band of the optical filter, and wherein the first group of refractive index layers and the second group of refractive index layers are each comprised of 20 to 40 layers, and
a light detection region formed in the semiconductor substrate,
wherein the Poisson ratio VS of the semiconductor substrate, Young's modulus ES of the semiconductor substrate, the radius r of the semiconductor substrate, the thickness b of the semiconductor substrate, stress σ in the dielectric multilayer film, and the thickness d of the dielectric multilayer film satisfy a relationship expressed by the following Expression (4):

$$1.0 \times 10^{-3} \geq \{3 \times r^2 \times d \times (1-VS) \times \sigma\}/(ES \times b^2) \qquad (4).$$

* * * * *